US012674864B2

(12) United States Patent
McLaughlin

(10) Patent No.: US 12,674,864 B2
(45) Date of Patent: Jul. 7, 2026

(54) ANALOG-TO-DIGITAL CONVERTER FOR RADAR SENSING

(71) Applicant: Qorvo US, Inc., Greensboro, NC (US)

(72) Inventor: Michael McLaughlin, Dublin (IE)

(73) Assignee: Qorvo US, Inc., Greensboro, NC (US)

( * ) Notice: Subject to any disclaimer, the term of this patent is extended or adjusted under 35 U.S.C. 154(b) by 283 days.

(21) Appl. No.: 18/392,115

(22) Filed: Dec. 21, 2023

(65) Prior Publication Data

US 2024/0219514 A1 Jul. 4, 2024

Related U.S. Application Data

(60) Provisional application No. 63/477,957, filed on Dec. 30, 2022.

(51) Int. Cl.
| | |
|---|---|
| *G01S 13/88* | (2006.01) |
| *G01S 7/282* | (2006.01) |
| *G01S 7/292* | (2006.01) |
| *H03M 1/08* | (2006.01) |
| *H03M 1/12* | (2006.01) |

(52) U.S. Cl.
CPC ............. *G01S 7/292* (2013.01); *G01S 7/282* (2013.01); *G01S 13/88* (2013.01); *H03M 1/0854* (2013.01); *H03M 1/089* (2013.01); *H03M 1/129* (2013.01)

(58) Field of Classification Search
CPC .......... G01S 7/292; G01S 7/282; G01S 13/88; H03M 1/0854; H03M 1/089; H03M 1/129
USPC ....................................................... 342/350
See application file for complete search history.

(56) References Cited

U.S. PATENT DOCUMENTS

| | | | |
|---|---|---|---|
| 8,744,418 B2 | 6/2014 | Novet | |
| 10,263,636 B2 | 4/2019 | Ruelke et al. | |
| 10,742,185 B1* | 8/2020 | Li ........................... | H03M 1/12 |
| 10,819,302 B1 | 10/2020 | Srinivasan et al. | |
| 11,740,327 B2* | 8/2023 | Slobodyanyuk ........ | G01S 7/418 342/93 |
| 11,774,553 B2* | 10/2023 | Santra ..................... | G01S 7/412 342/109 |
| 2006/0056547 A1 | 3/2006 | Buchali et al. | |
| 2020/0297236 A1* | 9/2020 | Rimini ................... | G01S 13/10 |
| 2021/0373127 A1* | 12/2021 | Slobodyanyuk ........ | G01S 7/411 |

(Continued)

FOREIGN PATENT DOCUMENTS

| | | |
|---|---|---|
| CN | 102636252 B | 11/2013 |
| JP | 6404075 B2 | 10/2018 |

(Continued)

*Primary Examiner* — Harry K Liu
(74) *Attorney, Agent, or Firm* — Fish & Richardson P.C.

(57) ABSTRACT

A sensing radar includes a transmitter configured to transmit bursts of pulses, a receiver configured to receive a signal comprising an echo from the bursts of pulses and a leakage of the bursts of pulses from the transmitter to the receiver; an analog-to-digital converter (ADC) coupled to the receiver, and a processor coupled to the ADC. At least one of thresholds of the ADC is configured such that the ADC has a chance of at least 5% to be tripped by thermal noise at an input of the ADC regardless of an amplitude of the signal. The processor is configured to process an output of the ADC at intervals of the bursts of pulses and ignore durations of transmitting the bursts of pulses to retrieve the echo from the signal.

20 Claims, 11 Drawing Sheets

(56) References Cited

U.S. PATENT DOCUMENTS

| 2022/0101863 A1* | 3/2022 | Lesso | G10L 21/0232 |
| 2023/0266464 A1* | 8/2023 | Yadagiri | G01S 7/4873 |
| | | | 356/5.01 |
| 2023/0359916 A1* | 11/2023 | Weber | G06N 10/40 |

FOREIGN PATENT DOCUMENTS

| WO | 2016110800 A1 | 7/2016 |
| WO | 2021074949 A1 | 4/2021 |

* cited by examiner

1100

1102 Operate ADC at a first threshold setting

1104 Receive radio frequency signal

1106 Detect signal characteristics of the radio frequency signal

1108 Operate ADC at a second threshold setting

1110 Retrieve target signal from regions corresponding to intervals between bursts of pulses

ANALOG-TO-DIGITAL CONVERTER FOR RADAR SENSING

CROSS-REFERENCE TO RELATED APPLICATIONS

This application claims priority benefit of the filing date of U.S. Provisional Patent Application No. 63/477,957, filed on Dec. 30, 2022, the disclosure of which is herein incorporated by reference in its entirety.

FIELD OF THE DISCLOSURE

The technology of the disclosure relates generally to improving the sensitivity of an analog-to-digital converter (ADC) in detecting a weak target signal under the interference of a strong leakage from a transmitter co-located in a radar sensing device.

BACKGROUND

A biometric sensing radar is a cutting-edge technology that leverages wireless technologies to detect objects in a given environment. By utilizing both hardware and software components, this radar system can be deployed throughout the environment to track vital signs. It operates by emitting sensing signals, such as electromagnetic waves, sound waves, and/or infrared lights, in the form of pulses towards a human (or an animal) body and then receiving radar echoes that are modulated by physiological activities such as breathing, heartbeat, and body movement. Through advanced signal processing techniques, the radar extracts vital signs-related signals, providing essential physiological and biological information about the human target, including parameters, waveforms, images, and target positions. This non-contact capability opens up a wide range of applications in medical monitoring, stability maintenance, post-disaster rescue, as well as battlefield search and rescue. Additionally, the radar can perform sensing and communication via various wireless technologies like Wi-Fi, 5G/New Radio (NR), Bluetooth™, and/or ultra-wideband (UWB), among others, further enhancing its versatility and potential impact in diverse fields.

A biometric sensing radar generally includes a transmitter (TX) path and a receiver (RX) path. In the RX path of a biometric sensing radar, an essential component that may be included is an analog-to-digital converter (ADC). The ADC plays a crucial role in converting the analog signals received from the radar echoes into digital data that can be processed and analyzed by the radar system's digital processing unit. Ideally, as radar echoes contain vital signs-related signals modulated by physiological activities, the ADC is supposed to accurately sample and quantize these analog signals, representing them as discrete digital values. This conversion process ensures that the radar system can effectively interpret and extract the physiological and biological information carried by the radar echoes. By converting the analog signals to digital format, the biometric sensing radar gains the capability to perform sophisticated signal processing, such as filtering, noise reduction, and feature extraction, enabling precise and reliable detection, monitoring, and imaging of life bodies in a non-contact manner. Realistically, the presence of leakage from a sensing radar's transmitter to its receiver can have a negative impact on the performance of the ADC. This leakage can occur through multiple paths, including from the TX antenna to the RX antenna or through the circuit board hosting the TX and the RX hardware. The leaked radar signals may carry an amplitude significantly larger than the actual radar echo signals received from the target. When these strong leaked signals mix with the weaker echoes in the receiver path, they can cause interference and distortion. The ADC, responsible for converting analog radar echoes to digital data, may become susceptible to saturation or clipping due to the overwhelming amplitude of the leaked signals. As a result, the ADC may fail to accurately sample and quantize the radar echoes, leading to erroneous or corrupted data. The presence of such interference can significantly compromise the sensing radar's ability to extract vital signs-related signals accurately, affecting the overall performance and reliability of biometric sensing.

SUMMARY

Example aspects of the present disclosure improve sensitivity of an ADC in a biometric sensing radar for the ADC to more easily discern weak target signal. For biometric sensing radar applications, target signal is usually interfered by leakage in the form of bursts of pulses from the transmitter. The leaked pulses usually have a much larger amplitude than the target signal. The leaked strong pulses, together with thermal noise, reduce an ADC's sensitivity in "seeing" the weak target signal. The leakage is either picked up by the receiver from an antenna-to-antenna air interface or directly from the circuit board hosting the transmitter and the receiver. The ADC threshold adjustments illustrated in the present disclosure allows the weak target signal to trip one or more of the ADC thresholds more often, which allows the ADC to discern the weak target signal more easily.

In one aspect, a sensing radar includes a transmitter configured to transmit bursts of pulses, a receiver configured to receive a signal comprising an echo from the bursts of pulses and a leakage of the bursts of pulses from the transmitter to the receiver, an analog-to-digital converter (ADC) coupled to the receiver, and a processor coupled to the ADC. At least one of thresholds of the ADC is configured such that the ADC has a chance of at least 5% to be tripped by thermal noise at an input of the ADC regardless of an amplitude the signal. The processor is configured to process an output of the ADC at intervals of the bursts of pulses and ignore durations of transmitting the bursts of pulses to retrieve the echo from the signal. In some instances, a lowest positive threshold of the ADC is positioned at a positive half of a root-mean-square (RMS) amplitude of the thermal noise, and a lowest negative threshold of the ADC is positioned at a negative half of the RMS amplitude of the thermal noise. In some instances, the thresholds of the ADC are evenly spaced. In some instances, the thresholds of the ADC are unevenly spaced. In some instances, a clipping level of the ADC is below an amplitude of the signal received by the ADC and in proximity of a root-mean-square (RMS) amplitude of the thermal noise. In some instances, the ADC is operable to work in a mid-tread threshold setting. In some instances, the ADC is operable to work in an on-tread threshold setting. In some instances, the bursts of pulses are based on an Ipatov sequence.

In another aspect, a biometric sensing radar includes a transmitter configured to transmit bursts of pulses, a receiver configured to receive a signal comprising an echo from the bursts of pulses and a leakage of the bursts of pulses from the transmitter to the receiver, an analog-to-digital converter (ADC) coupled to the receiver, and a processor coupled to the ADC. The ADC is operable to work in an on-tread threshold setting. In some instances, under the on-tread threshold setting, thresholds of the ADC are evenly spaced.

In some instances, under the on-tread threshold setting, thresholds of the ADC are unevenly spaced. In some instances, under the on-tread threshold setting, a threshold adjacent to a zero level of the ADC is positioned at a half of a noise root-mean-square (RMS) amplitude. In some instances, the processor is configured to process an output of the ADC at intervals of the bursts of pulses and ignore durations of transmitting the bursts of pulses to retrieve the echo from the signal, and wherein the processing of the output of the ADC includes a filtering process to filter out quantization of thermal noise. In some instances, the ADC is operable to work in a mid-tread threshold setting and switch from the mid-tread threshold setting to the on-tread threshold setting under a control of the processor.

In another aspect, a biometric sensing radar includes a transmitter configured to transmit bursts of pulses, a receiver configured to receive a signal comprising an echo from the bursts of pulses and a leakage of the bursts of pulses from the transmitter to the receiver, an analog-to-digital converter (ADC) coupled to the receiver, and a processor coupled to the ADC. The processor is configured to set the ADC to work in a first threshold setting, detect characteristics of the signal from output of the ADC, set the ADC to work in a second threshold setting different from the first threshold setting, and retrieve the echo from the signal. In some instances, the first threshold setting is a mid-tread threshold setting, and the second threshold setting is an on-tread threshold setting. In some instances, the first threshold setting is a first mid-tread threshold setting with evenly spaced thresholds, and the second threshold setting is a second mid-tread threshold setting with unevenly spaced thresholds. In some instances, under the second mid-tread threshold setting, a lowest positive threshold above a zero level of the ADC is positioned at a positive half of a noise root-mean-square (RMS) amplitude, and a lowest negative threshold under the zero level of the ADC is positioned at a negative half of the noise root-mean-square (RMS) amplitude. In some instances, the second threshold setting includes superimposing a square wave on the signal, and a swing of the square wave is one ADC step-size. In some instances, the first threshold setting includes a first ADC clipping level, and the second threshold setting includes a second ADC clipping level that is lower than the first ADC clipping level.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

Figure 1:
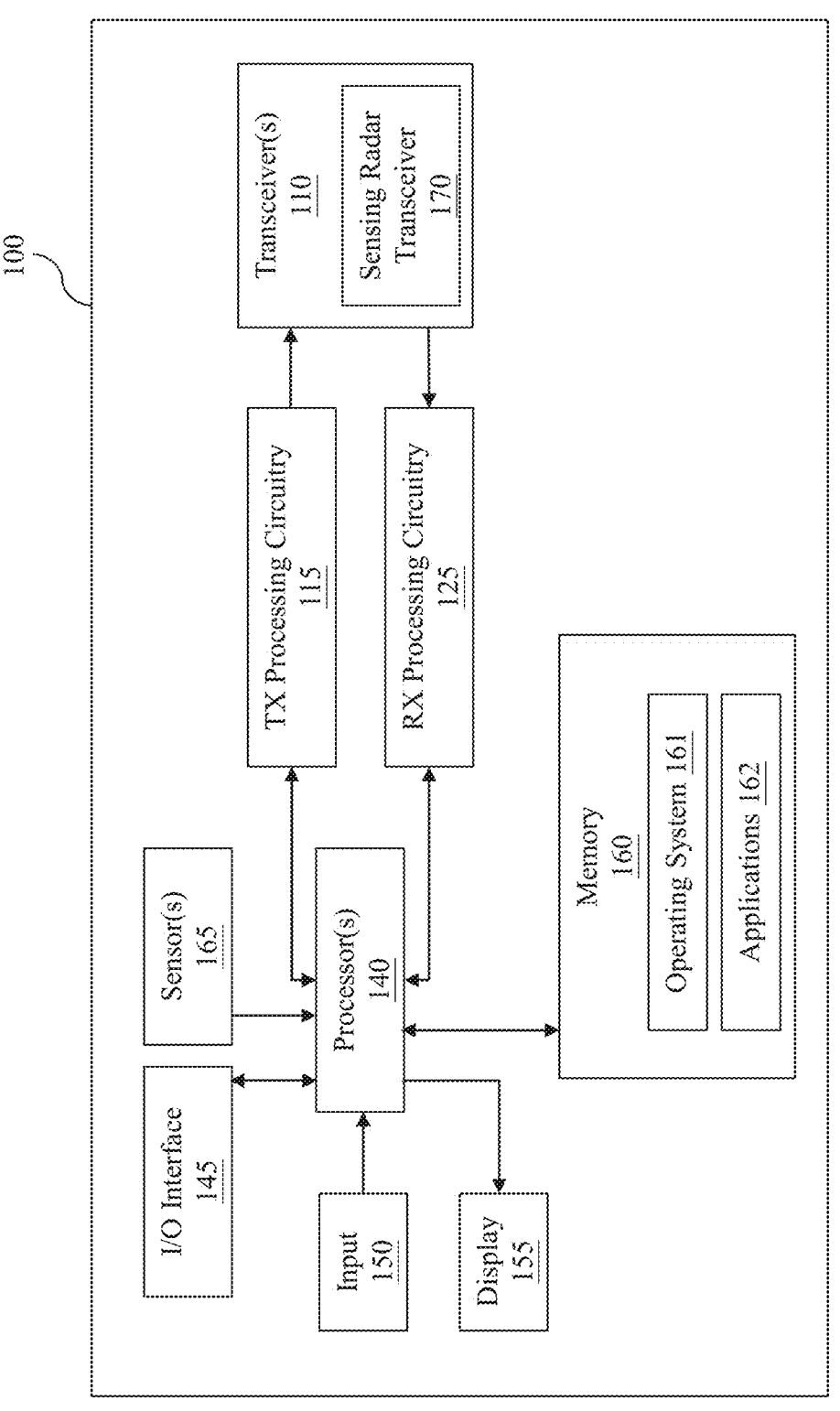
FIG. 1 illustrates a block diagram of an electronic device capable of wireless sensing according to some aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected", "operably connected", "coupled", "operably coupled" or "electrically coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re described.

Radar, short for "radio detection and ranging", have been employed to detect objects like aircraft, motor vehicles, and terrain by transmitting electromagnetic radiation and then measuring the properties of the backscattered waves (or echoes) to determine the object's range, angle of reflection, and velocity. Recent advancements have seen the integration of digital signal processing (DSP) algorithms and machine learning into radar systems, enabling exploration of radar's potential in other applications. For instance, radar systems have been utilized for gesture recognition and low-cost biometric sensing.

A sensing radar may send out interrogating pulses towards an object and detect echoes bounced back from the object. Some examples in the present disclosure use radio frequency sensing, commonly known as RF sensing, in which RF signals are transmitted as interrogating pulses. Those skilled in the art will appreciate various aspects of the systems and techniques outlined in the present disclosure can also be applied to interrogating pulses transmitted in other forms, such as sound waves and/or infrared lights.

The widespread adoption of mobile computing technology, including portable electronic devices, has been significantly driven by factors like usability, convenience, and enhanced computing power. As a result of recent technological advancements, electronic devices have become more compact while simultaneously offering an expanding range of functions and features. For instance, certain electronic devices not only provide voice call services through mobile communication networks but also offer radar sensing capabilities. Sensing radar can function across various frequency bands, including but not limited to 6-8 GHz, 28 GHz, 39 GHz, 60 GHz, and 77 GHz. The sensing radar may actively send out interrogating pulses, such that the electronic devices' capabilities extend to detecting motion presence, patterns (e.g., walking, falling, gestures), determining motion location, tracking object movement over time, and even capturing vital signs of individuals or animals (e.g., breathing, heart rate), among other potential uses.

The following discussion will explore various aspects of the systems and techniques outlined here, with reference to the accompanying figures. FIG. 1 depicts an exemplary electronic device in accordance with an embodiment of this disclosure. In particular, FIG. 1 depicts an exemplary electronic device 100, and the electronic device 100 can be a wireless sensing device or a mobile communication device capable of wireless sensing, such as, a mobile station, a subscriber station, a wireless terminal, a desktop computer, a portable electronic device, a wearable device, a tracking device, a medical monitoring device, Internet of Things (IoT) devices, vehicles, a robot, and the like.

As depicted in FIG. 1, the electronic device 100 may include transceiver(s) 110, transmit (TX) processing circuitry 115, and receive (RX) processing circuitry 125. The transceiver(s) 110 may include, for instance, an RF transceiver, an ultra-wideband (UWB) transceiver, a BLUETOOTH transceiver, a Wi-Fi transceiver, a ZIGBEE transceiver, an infrared transceiver, and various other wireless communication signals. Moreover, the electronic device 100 features a processor 140, an input/output (I/O) interface 145, an input 150, a display 155, a memory 160, and a sensor 165. Within the memory 160 resides an operating system (OS) 161, in addition to one or more applications 162.

The transceiver(s) 110 may contain an antenna array with multiple antennas. These antennas have a radiating element made of conductive material or a conductive pattern on a substrate. The transceiver(s) 110 sends and receives RF signals to/from the electronic device 100. The transceiver(s) 110 converts the incoming RF signal to an intermediate frequency or baseband signal. This signal is sent to the RX processing circuitry 125, which filters, decodes, and/or digitizes it to generate a processed baseband signal. This signal is then transmitted to the processor 140 for further processing.

The TX processing circuitry 115 receives outgoing baseband data from the processor 140. It encodes, multiplexes, and/or digitizes the outgoing baseband data to generate a processed baseband or intermediate frequency signal. The transceiver(s) 110 receives this processed baseband or intermediate frequency signal from the TX processing circuitry 115 and up-converts it to an RF signal for transmission.

The processor 140 may include one or more processors or other computing devices. The processor 140 can execute instructions stored in the memory 160, such as the OS 161, to control the overall operation of the electronic device 100. For instance, the processor 140 could manage the reception of incoming signals and the transmission of outgoing signals by the transceiver(s) 110, the RX processing circuitry 125, and the TX processing circuitry 115 following well-known principles. The processor 140 can include any suitable number and type of processors or other devices in any suitable arrangement. For example, in some embodiments, the processor 140 includes at least one microprocessor or microcontroller. Exemplary types of processor 140 include microprocessors, microcontrollers, digital signal processors, field programmable gate arrays, application specific integrated circuits, and discrete circuitry. In some embodiments, the processor 140 may include a neural network.

The processor 140 may also execute other processes and programs stored in the memory 160, such as operations that receive and save data. The processor 140 can transfer data to or from the memory 160 as needed by an executing process. In some embodiments, the processor 140 is configured to execute one or more applications 162 based on the OS 161 or in response to signals from external sources or a user. For example, applications 162 can include an electrocardiogram (ECG) monitoring application, and so on.

The processor 140 is connected to the I/O interface 145, which allows the electronic device 100 to connect to other accessories. The I/O interface 145 serves as the communication path between these accessories and the processor 140.

The processor 140 is also connected to the input 150 and the display 155. The user of the electronic device 100 can use the input 150 to enter data or commands into the device. The input 150 can be a keyboard, touchscreen, mouse, trackball, voice input, or other user interface device. For example, the input 150 can include voice recognition processing for voice commands or a touch panel that recognizes touch inputs using various schemes. The input 150 can also be associated with sensors, a radar transceiver, a camera, and other devices that provide additional inputs to the processor 140.

The display 155 can be an LCD, LED, OLED, AMOLED, or other type of display capable of rendering text and graphics. It can be a single or multiple display screens and can create a stereoscopic display. In some embodiments, the display 155 is a heads-up display (HUD).

The memory 160 is connected to the processor 140 and can include RAM, Flash memory, or other ROM. It can also include persistent storage for longer-term data storage. The memory 160 can contain one or more components or devices for storing and retrieving information.

The electronic device 100 also includes one or more sensors 165 that measure physical quantities or detect activation states and convert this information into electrical signals. These sensors can include buttons for touch input, cameras, gesture sensors, optical sensors, IMUs such as gyroscopes and accelerometers, air pressure sensors, magnetic sensors, grip sensors, proximity sensors, ambient light sensors, bio-physical sensors, temperature/humidity sensors, illumination sensors, UV sensors, EMG sensors, EEG sensors, ECG sensors, IR sensors, ultrasound sensors, iris sensors, fingerprint sensors, color sensors such as RGB sensors and more. These sensor(s) may be located within the electronic device 100 or within a secondary device connected to it.

One or more of the transceivers 110 is a sensing radar transceiver 170 configured to transmit and receive signals for biometric sensing. In some instance, the sensing radar transceiver 170 can operate both radar and communication signals concurrently and includes one or more antenna arrays or pairs, each with a transmitter and receiver. The sensing radar transceiver 170 may be capable of transmitting RF signals at one or various frequencies, including 6 GHZ, 7 GHZ, 8 GHZ, 28 GHz, 39 GHz, 60 GHZ, and 77 GHz. In some embodiments, the signals transmitted can include millimeter wave (mmWave) signals. The radar transceiver 170 can receive these signals after they have bounced off target objects in the surrounding environment.

In some embodiments, the sensing radar transceiver 170 is a monostatic radar with the transmitter and receiver positioned at the same or similar location. They can use the same antenna or separate but adjacent antennas. Monostatic radars are assumed coherent with a common time reference for synchronization.

In some embodiments, the sensing radar transceiver 170 includes a transmitter that sends RF signals and a receiver that receives these signals after they have bounced off target objects. The processor 140 can analyze the time difference between transmission and reception to measure the distance of target objects from the electronic device 100. Based on these time differences, the processor 140 can generate an image of the object by mapping the various distances.

In some instances, the sensing radar transceiver 170 can be an ultra-wideband (UWB) transceiver. UWB is an Institute of Electrical and Electronic Engineers (IEEE) 802.15.4a/z standard technology optimized for secure micro-location-based applications. It is capable of measuring distance and location with extended range (e.g., up to 70 meters) and unprecedented accuracy (e.g., within a few centimeters), compared to such traditional narrowband technologies as Wi-Fi and BLUETOOTH. In 2002, the Federal Communications Commission (FCC) granted permission for the unlicensed use of ultra-wideband (UWB) technology within the frequency range of 3.1 to 10.6 GHZ. This authorization involved utilizing an appropriate wideband signal format with a low equivalent isotropically radiated power (EIRP) level (−41.3 dBm/MHz). Since then, UWB technology has garnered increasing interest across various industries and sectors, including wireless communications and radar sensor applications.

UWB systems fall into two main categories: 1) multi-band orthogonal frequency division multiplexing (MB-OFDM) UWB, and 2) impulse radio UWB (IR-UWB). The former is mainly employed for applications demanding extremely high data rates, such as video streaming, but it is not suitable for energy-constrained applications due to the need for high-performance electronics to operate an MB-OFDM radio. Conversely, IR-UWB radar offers the advantage of accommodating low-power consumption and low-complexity. An IR-UWB radar has become a research hotspot in post-disaster search and rescue fields due to its excellent performance including enhanced penetration capabilities, robustness against interference and multipath effects, and high-precision ranging. These characteristics have sparked interest in both the research community and industry to explore the use of IR-UWB radars in energy-constrained, short-range wireless biometric sensing applications.

Figure 2:
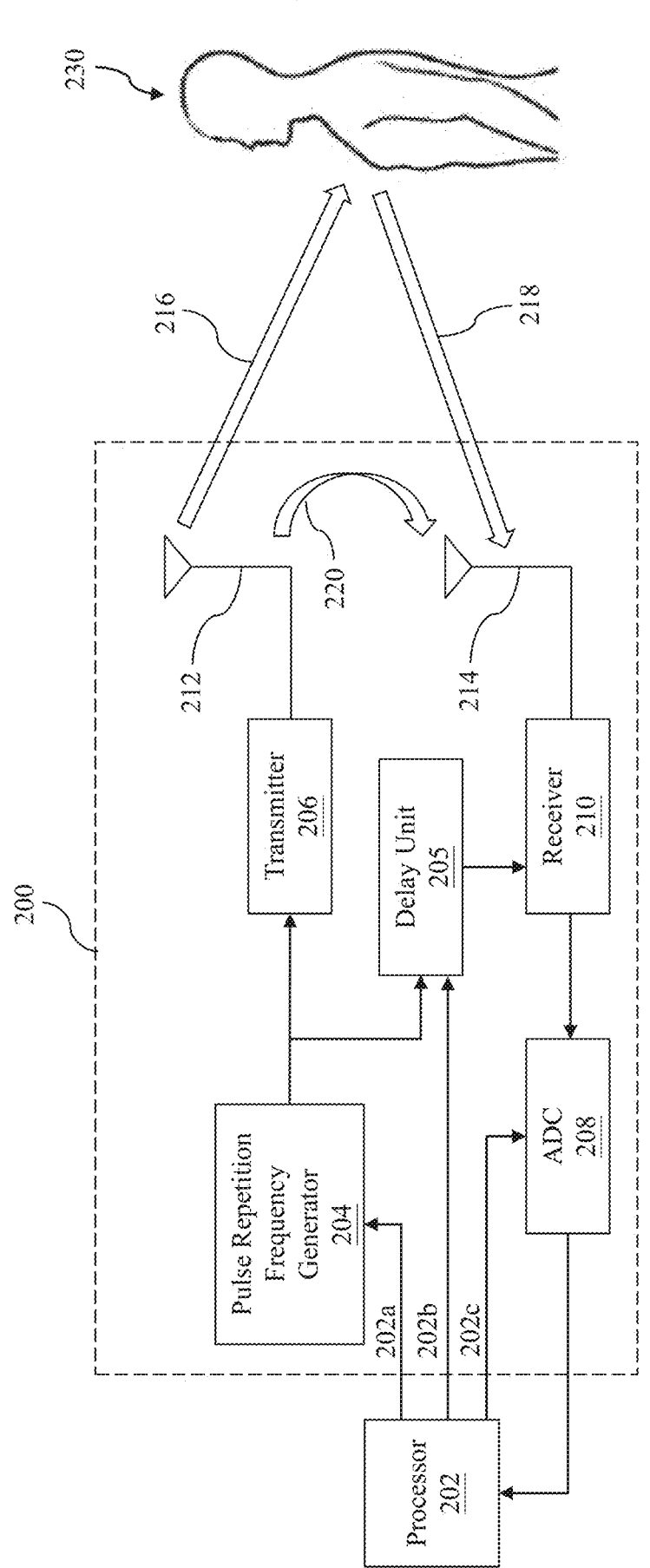
FIG. 2 illustrates a block diagram of a sensing radar transceiver according to some aspects of the present disclosure.

FIG. 2 shows an example of a sensing radar transceiver 200 that is part of an IR-UWB radar. The sensing radar transceiver 200 includes a pulse repetition frequency (PRF) generator 204, a delay unit 205, a transmitter (TX) 206, an analog-to-digital converter (ADC) 208, a receiver (RX) 210, one or more TX antennas 212, and one or more RX antennas 214. The processor 202 generates timing and control signals 202a, 202b, 202c to synchronize and manage operations of the sensing radar transceiver 200. The processor 202 may be similar to the processor 140 of FIG. 1. The sensing radar transceiver 200 may be similar to the sensing radar transceiver 170 of FIG. 1. Alternatively, the transmitter 206, the receiver 210, the TX antenna(s) 212, and the RX antenna(s) 214 can be included within the sensing radar transceiver 170 of FIG. 1, the PRF generator 204 and the delay unit 205 can be included within the TX processing circuitry 115 of FIG. 1, and the ADC 208 can be included within the RX processing circuitry 125 of FIG. 1. The sensing radar transceiver 200 uses IR-UWB sensing techniques to perform functions such as detecting the presence or biometric characteristics of a user 230, such as motion detection, vital sign detection, heartbeat detection, or other functions.

Based on timing and control signals 202a from the processor 202, the PRF generator 204 creates the baseband pulse train (or pulse sequence) used by the RF transmitter 206 and, after the delay unit 205, by the RF receiver 210. Alternately, both the transmitter 206 and the receiver 210 may receive a delayed signal from the PRF generator 204. Further, the delay applied to either or both of the transmitter 206 and the receiver 210 may be fixed or variable.

Since the pulse train is common to both the transmitter and receiver subsystems and allows them to operate synchronously, the system is a time-coherent radar system. In practice, a voltage-controlled oscillator (VCO) operating at a nominal output frequency is associated with the PRF generator 204. Randomized pulse-to-pulse dither can be added by injecting a noise signal from a noise signal source into the VCO control port. The random dither causes spectral spreading to reduce the probability of interfering with other electronic devices as well as provide a unique transmit coding pattern per unit, mitigating mutual interference from other units operating in close proximity.

The transmitter 206 generates a sequence of short-duration pulses (in one instance, less than 200 ps) based on the pulse train from the PRF generator 204. Achieving sub-nanosecond pulses involves differentiating the edges of the pulse train with extremely rapid rise and fall times. Through the combination of the transmitter and the antenna, these short pulses are converted into an ultra-wideband spectrum signal centered in the RF/microwave frequency bands.

In one configuration, the transmitter 206 and the receiver 210 share a common antenna. Alternatively, they may have separate TX antenna 212 and RX antenna 214. In the transmit mode, the TX antenna 212 delivers TX waveform 216 as short pulses to the environment, such as towards the user 230. Subsequently, RX waveform 218 as reflections are received from the environment and fed to the receiver 210. Different antenna designs, including commercially available horns, flat resonators, and magnetic dipole antennas, are possible.

The delay unit 205, based on timing and control signals 202b from the processor 202 and pulses from the PRF generator 204, generates a delayed version of the PRF timing signal. The output of the delay unit 205 triggers a sample-and-hold circuit in the receiver 210 where the delay value is chosen to compensate for fixed electrical delays within the system and focus data collection to those reflections originating from a specific depth within the body of the user 230.

The receiver 210 processes the raw reflections received from the RX antenna 214 in the analog domain to optimize the signals of interest. For example, for cardiopulmonary data, the optimization includes suppressing the high-strength static return signals and amplifying the motion artifacts. The receiver 210 may be based on a dual-channel balanced receiver architecture. The balanced receiver architecture provides a high degree of common mode rejection as well as differential gain. The common mode rejection provides a significant amount of attenuation to signals common to both channels thus minimizing interference from the transmit signal with the desired received signal. The differential gain inherent in this architecture amplifies signals unique to either channel thus the received signal, being unique to the channel, is amplified.

Both channels can use an ultra-fast sample-and-hold (S/H) circuit, each triggered by the delayed impulse train created by the pulse generator using the delayed pulse train from the delay unit 205. The active sampling window is set at approximately 320 ps in one example and can be easily modified by selectively changing the value of a single passive component. The outputs of the two S/H circuits are integrated over multiple samples in integrator elements to improve the signal-to-noise ratio. The integrated samples feed the inverting and non-inverting inputs of an instrumentation amplifier, attenuating the transmitted signal and amplifying the received signal.

As illustrated in FIG. 2, the ADC 208 is controlled by the processor 202 through control signal 202c. The processor 202 sets the sample rate, sample resolution, and start/stop timing for the sampling process based on the mode of operation. As described subsequently, the processor 202 may also set ADC thresholds dynamically to improve ADC sensitivity and resolution. The ADC 208 digitizes the enhanced analog motion reflections from the receiver 210, translating the enhanced reflected energy into a series of discrete digital values. As one example, a 4-bit ADC may be used as a trade-off between resolution and system simplicity for low-cost sensing. In some instances, output from the receiver 210 can include in-phase (I) and quadrature (Q) components, and correspondingly the ADC 208 includes two ADCs, such as two 4-bit ADCs as one example, in the receiver path to convert respective in-phase and quadrature (I and Q) signals from the analog domain to digital domain.

The digitized signal from the ADC 208 is then processed to extract pertinent physiological information in the processor 202. The signal processing may accommodate a wide variety of algorithms in support of different medical applications. In addition the algorithm can be implemented using parallel, serial, or hybrid parallel/serial architecture. The choice of a specific architecture is left to those skilled in the art and will depend on the application and other system constraints.

The resultant physiological data is displayed on a user interface, such as the display 155 of FIG. 1. This can include tracings of amplitude versus time for one or more depths of interest, power spectral density for one or more depths of interest, time domain and frequency domain histograms for a range of depths, numerical values for heart and/or lung rates, as well as the associated confidence factors for the displayed data. The processor 202 of FIG. 2 converts the data from the signal processor to an operator-friendly format for display on the user interface.

By implementing simultaneous transmit and receive functionality, the sensing radar transceiver 200 can receive any signals corresponding to the TX waveform 216. For instance, the sensing radar transceiver 200 can receive signals reflected from objects or people within range of TX waveform 216, such as RX waveform 218 reflected from user 202. The sensing radar transceiver 200 may also receive leakage signals (e.g., TX leakage signal 220) directly coupled from TX antenna 212 to RX antenna 214 without reflecting from any objects. For instance, leakage signals may include signals transferred through an air interface between the TX antenna 212 and the RX antenna 214 without reflecting from any objects. Alternatively, the TX antenna 212 and the RX antenna 214 may be the same antenna or the same antenna array, and leakage signals may include signals reflected from the antenna back into the RX receiver 210. In furtherance, leakage signals may include signals transferred from the RF transmitter 206 to the RF receiver 210 through the circuit board hosting the TX transmitter 206 and the RF receiver 210 without through an air interface between the TX antenna 212 and the RX antenna 214.

In an impulse radio-based sensing system, where transmission and reception are simultaneously conducted, a critical challenge arises from the leakage of the transmitter signal interfering with the signal of interest arriving at the receiver and the ADC. This interference can be particularly problematic, especially when the target signal level (the reflected signal arriving at the input of an ADC) may be as low as −120 dBm. Regarding the transmitted signal level, the peak-to-mean ratio (PAR) of an IEEE 802.15.4a/z signal is dependent on the PRF. For PRFs of 16 MHZ, 64 MHZ, and 111 MHZ, the corresponding passband PARs are generally of 21 dB, 15 dB, and 10.5 dB, respectively. Meanwhile, the antenna-to-antenna leakage may be as high as −30 dB, and the on-chip leakage and the leakage through external circuitry may be as high as −40 dB. Compounding the issue, the transmitted signal can be as strong as −14 dBm, further amplified by up to 12 dB through gating gain, resulting in peak leakage signals reaching up to −10 dBm in the passband and −13 dBm in the baseband. Such high levels of interference pose significant challenges for signal processing and degrade overall system performance. Consequently, to mitigate this interference, one solution is to limit the gating gain to 0 dB and restrict the PRF to 111 MHz in trading for a smaller PAR of 10.5 dB. This approach limits the peak baseband voltage to about −36 dBm in order to reduce interference but with the cost of extending the airtime beyond the usual limits. However, even with these measures in place, the impact of thermal noise remains a concern. Assuming a 5 dB noise figure, an ADC input may experience approximately −85 dBm of thermal noise on average.

Figure 3:
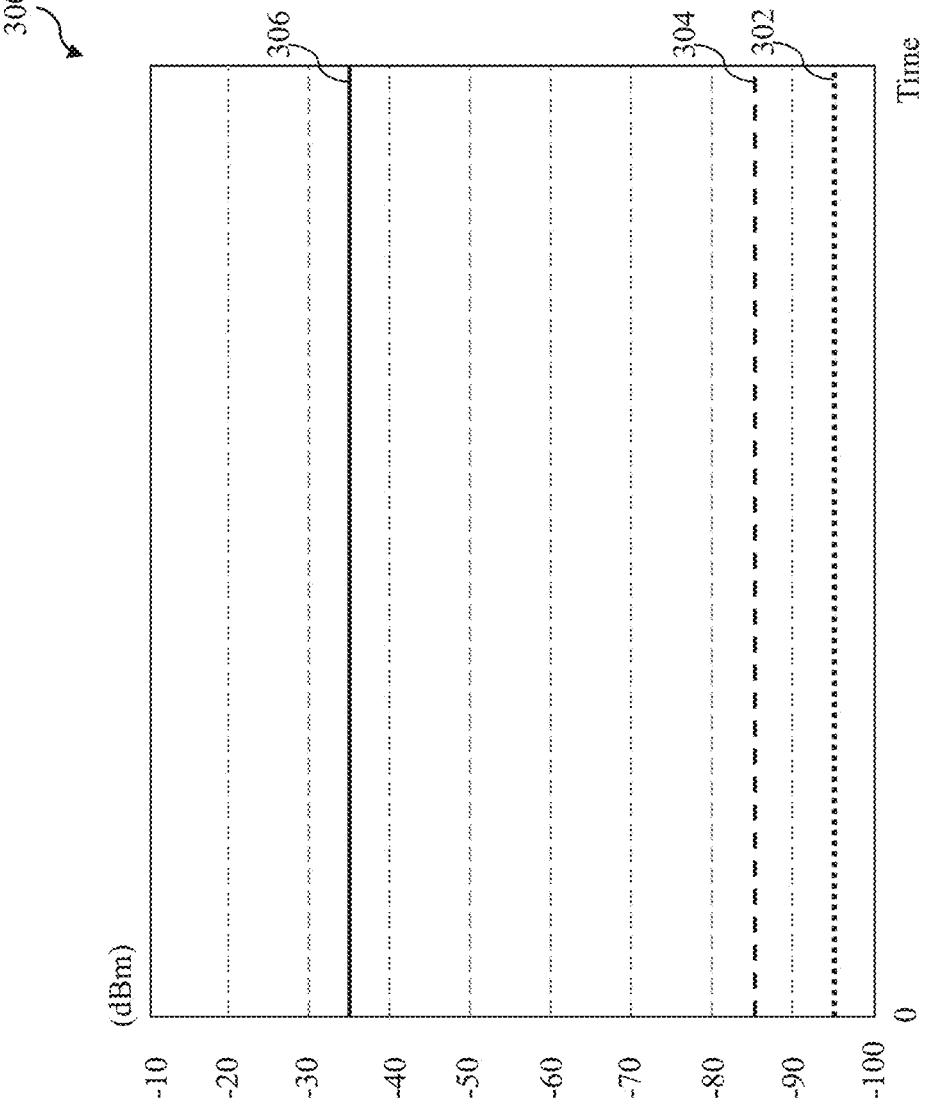
FIG. 3 illustrates a diagram showing signal levels arriving at an ADC in a receiver path according to some aspects of the present disclosure.

FIG. 3 shows a diagram 300 illustrating signal levels arriving at the input of a 4-bit ADC in an exemplary IR-UWB radar. The signal levels are measured in dBm. The IR-UWB radar provides a 0 dB RF gain and a 5 dB noise figure. Line 302 represents the target signal level, line 304 represents thermal noise, and line 306 represents overall leakage from the transmitter. As shown in the diagram, the target signal level is about −95 dBm. The thermal noise level is about −85 dBm, which is about 10 dBm higher than the target signal. What is dominant is the leakage from the transmitter, which is about −35 dBm. The ADC's ability to detect and accurately measure weak input signals, such as the target signal at −95 dBm, is compromised due to the dominating interference from the higher-level leakage signal at −35 dBm and the thermal noise at −85 dBm. Consequently, to achieve accurate signal detection and processing, a higher-bit ADC, such as a 9-bit ADC, may be required for meeting the minimum threshold requirements.

While a higher-bit ADC, such as a 9-bit ADC, indeed offers higher resolution compared to a lower-bit ADC, such as a 4-bit ADC, it also comes with certain disadvantages that should be taken into consideration in the design and implementation of a system. One primary drawback of using a higher-bit ADC is increased complexity and cost. The additional bits require more circuitry and finer manufacturing processes to achieve the higher resolution, leading to higher production costs. Moreover, the increased complexity can also result in higher power consumption, which can be a critical concern in power-constrained applications. Furthermore, a higher-bit ADC may also demand more processing power and memory resources in the digital domain. Handling and storing the larger digital data from a higher-bit ADC can impose computational overhead and increase memory requirements in the digital signal processing stages of the system.

On the other hand, a lower-bit ADC, such as a 4-bit ADC, requires less circuitry and processing resources compared to higher-bit counterparts. This reduced complexity results in lower manufacturing costs and power consumption, making it an attractive option for applications with strict budget constraints or where power efficiency is critical, particularly in low-power sensing radar applications. But, as discussed above, in light of the severe interference from the leakage signal, it's important to note that the advantages of using a lower-bit ADC come at the cost of reduced resolution. For example, in an IR-UWB radar for heartbeat detection application, a conventional 4-bit ADC with added dither may only give between 4 dB and 11 dB of signal-to-noise ratio (SNR), while 12 dB SNR is typically required for a successful detection. Therefore, a solution that allows an ADC with a small number of bits to convert a weak target signal with a mixture of other strong interfering signals and get the effective performance of an ADC with extra more bits becomes critical in research and development of next generation biometric sensing radars.

Figure 4:
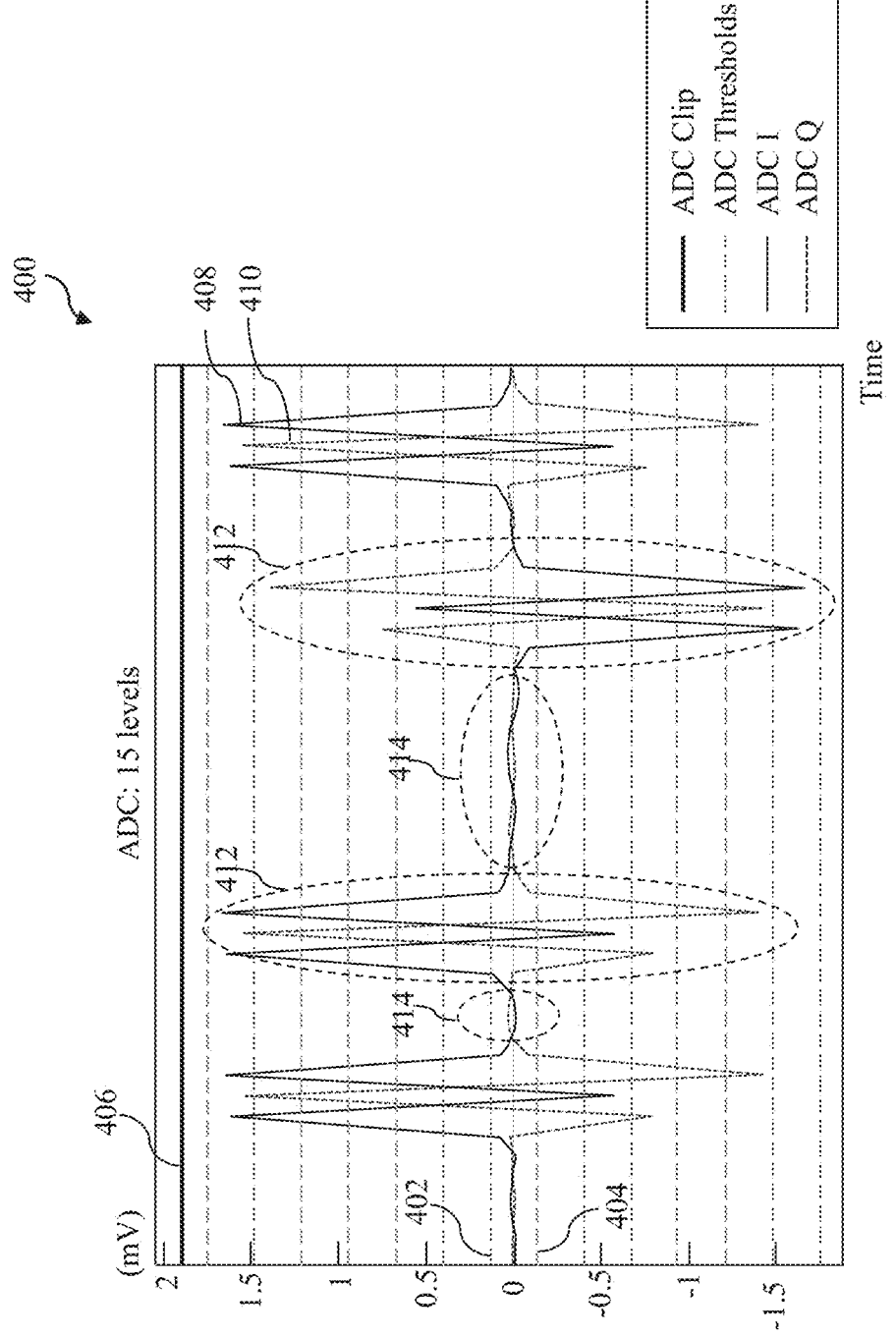
FIG. 4 illustrates a diagram showing signal waveforms arriving at an ADC with thresholds in mid-tread configuration according to some aspects of the present disclosure.

FIG. 4 shows a diagram 400 further illustrating the challenges of implementing a lower-bit ADC in an IR-UWB radar. In this instance, the receiver path provides in-phase and quadrature (I and Q) paths with a 4-bit ADC in each path, respectively. Each 4-bit ADC provides 15 levels. Alternatively, the functions of the two 4-bit ADCs may be integrated in a single 4-bit ADC with two input ports, an in-phase input port and a quadrature input port. The thresholds of the 4-bit ADC are represented by horizontal dash lines in the diagram 400. The thresholds are uniformly spaced, which is termed uniform quantization. Two middle thresholds 402 and 404 (i.e., the lowest positive threshold and the lowest negative threshold) are specifically marked in the diagram 400. As the zero level (or origin) is positioned between these two thresholds, a signal with an amplitude between the two thresholds 402 and 404 will have a zero-valued reconstruction level (corresponding to a tread of an ADC stair-case output). Such configuration of thresholds is termed mid-tread. State differently, in a mid-tread configuration, the zero level is position between two middle thresholds of the ADC, and the thresholds are spread in positive and negative sides of the zero level.

Horizontal line 406 in the diagram 400 marks where the ADC clips. ADC clipping, also known as "overload" or "saturation," occurs when the input signal to an ADC exceeds the ADC's maximum voltage range. In this situation, the ADC is unable to represent the entire amplitude of the input signal accurately, resulting in the ADC output being "clipped" or truncated at its maximum value. As a consequence, any signal components that exceed the ADC's input range are lost, leading to data loss and distortion in the digitized output.

Solid line 408 represents the waveform of the in-phase (I) signal arriving at the input of the ADC in the in-phase (I) path, and dotted line 410 represents the waveform of the quadrature (Q) signal arriving at the input of the ADC in the quadrature (Q) path. Each waveform represents a mixture of a target signal (echo signal) that carries useful biometric information and two other signals—a high amplitude leakage signal and a low amplitude thermal noise—that interfere the target signal. An ADC is expected to correctly sample and quantify the target signal to retrieve the useful biometric information.

However, the difficulty for a 4-bit ADC, if not completely impossible, to see the target signal riding on top of the leakage signal and the thermal noise can be explained by examining the waveforms I and Q in regions 412 and 414 in the diagram 400. The parts of the waveforms I and Q within the regions 412 are at the moments when the transmitter is actively transmitting the bursts of pulses. The parts of the waveforms I and Q within the regions 414 are during intervals between the bursts of pulses. The duration of the regions 412 may be uniform, and the duration of the regions 414 may be uniform too. In the depicted instance, the duration of the regions 412 is non-uniform, and the duration of the regions 414 is non-uniform too. For example, the pulses may be transmitted in a preamble sequence represented by an Ipatov sequence (e.g., Ipatov 91 and Ipatov 127 as defined in 802.15.4a and 802.15.4z). An Ipatov sequence does not use a constant interval between pulses.

In the regions 412, the strong leakage in the form of pluses is dominant. The quantization of the ADC reflects basically the amplitude of the leaked pulses. The ADC is not able to see the target signal in the regions 412. On the other hand, it is possible for the ADC to see the target signal in the regions 414, as the strong leaked pulses is absent in the regions 414 and the interference is caused by the thermal noise which can be filtered in digital processing. Even so, as depicted in the diagram 400, under the mid-tread configuration, the target signal is not strong enough to trip the ADC thresholds. Even the lowest positive threshold 402 and the lowest negative threshold 404 may be distant from a typical amplitude of the target signal for the target signal to trip. The spacing between the two adjacent thresholds is called one ADC step-size or one ADC unit amplitude. In other words, the ADC step-size may be too large for a small amplitude target signal to trip. As discussed above, using a higher-bit ADC for reducing the ADC step-size may not be feasible in a low-cost sensing implementation.

For the target signal to more occasionally cross the thresholds, one possible way is to add uniform dither, such as uniform dither with +/−half of an ADC step-size. While dither can help in detecting small target signals, it can also exacerbate quantization error. The introduction of dither can also introduce nonlinearity in the ADC's response. This nonlinearity can lead to irregularities in the digitization process and may cause signal distortion, impacting the fidelity of the ADC's output. The trade-off between dither-induced noise and quantization error needs careful consideration to strike a balance between detectability and overall signal accuracy.

Figure 5:
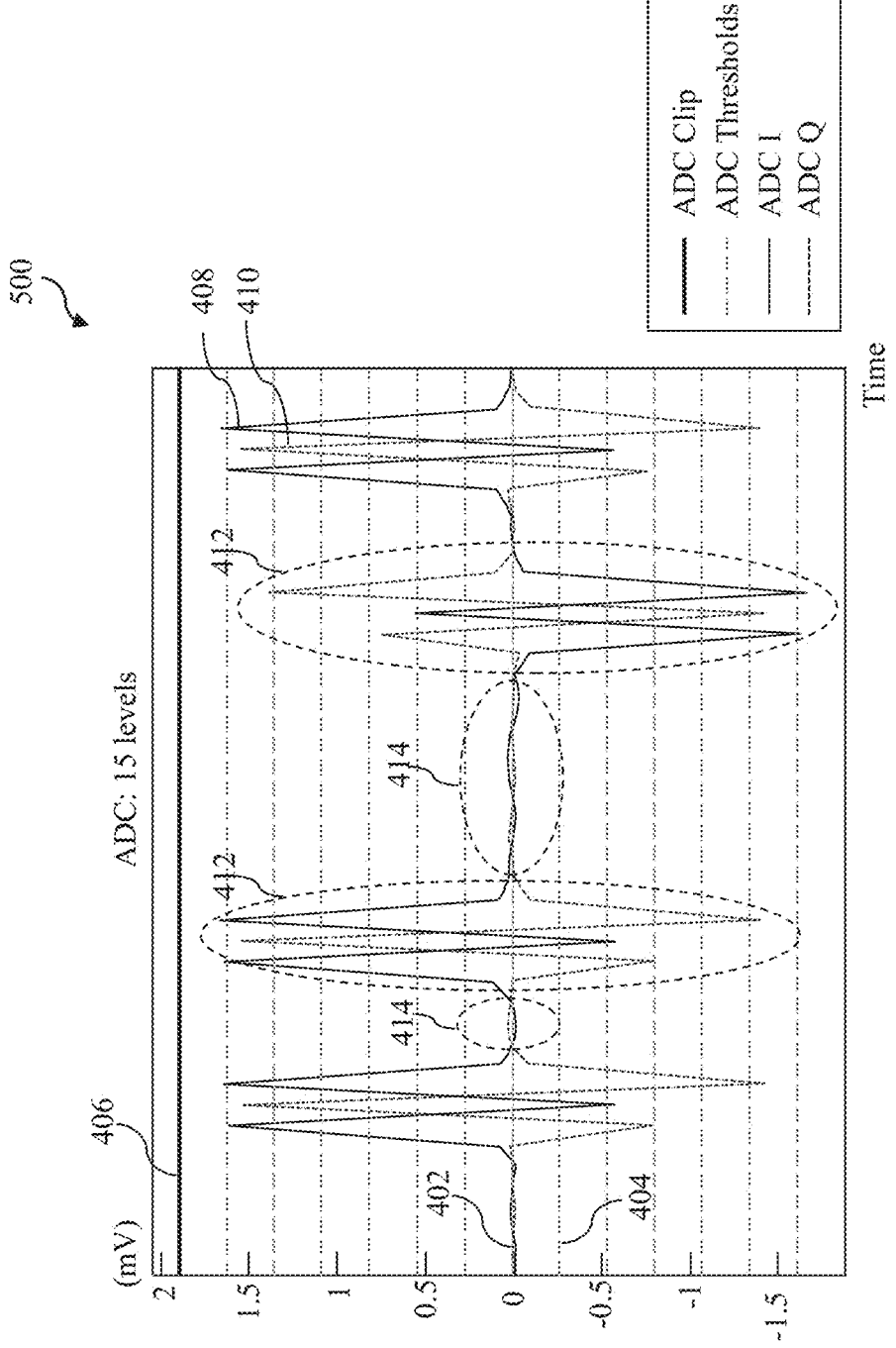
FIG. 5 illustrates a diagram showing signal waveforms arriving at an ADC with thresholds in on-tread configuration according to some aspects of the present disclosure.

FIG. 5 shows a diagram 500 illustrating an improvement to a lower-bit ADC in an IR-UWB radar allowing the target signal to more occasionally cross the thresholds of the ADC. The diagram 500 is similar to the diagram 400 of FIG. 4, but with the ADC set in a mid-rise configuration. The mid-rise configuration is so called because the zero level (or origin) lies in the middle of a raising part of the ADC stair-case output. The mid-rise configuration is also referred to as on-tread configuration. State differently, in a mid-rise configuration, a middle threshold of the ADC is set at the zero level with other thresholds spread in positive and negative sides of the zero level. In the diagram 500, the thresholds in the diagram 400 are shifted down half of an ADC step-size, such that the lowest positive threshold 402 in the diagram 400 is now positioned at the zero level and the lowest negative threshold 404 in the diagram 400 is now an ADC step-size away from the zero level. The horizontal line 406 showing where the ADC clips may remain the same in the diagrams 400 and 500. In another instance, the thresholds may be shifted up half of an ADC step-size, such that the lowest negative threshold 404 in the diagram 400 is now positioned at the zero level and the lowest positive threshold 404 in the diagram 400 is now an ADC step-size away from the zero level.

In one instance, the ADC is originally set as in the on-tread configuration, such that since a power-on event, the ADC is in the on-thread configuration. In another instance, the ADC is initially set as in the mid-tread configuration (such as the thresholds in the diagram 400), and during the operation, a processor (e.g., the processor 202 of FIG. 2 or the process 140 of FIG. 1) dynamically shifts the ADC thresholds to the on-tread configuration to meet the performance needs.

In wireless applications, setting an ADC in the receiver path to be in the on-tread configuration is counterintuitive. This is because such a quantization approach is sensitive to variations in the analog input voltage, particularly when noise is present. When an ADC is set to on-tread quantization, the ADC's decision threshold is placed midway between two digital levels. In this configuration, the ADC interprets an analog input voltage that falls on or above the threshold as one digital level, while an input voltage below the threshold is interpreted as the other digital level. In the presence of noise, the analog input voltage can fluctuate around the decision threshold, causing frequent crossings back and forth across the threshold. As a result, the ADC will make rapid transitions between adjacent digital levels, leading to numerous false readings. These false readings arise because the noise-induced fluctuations cause the ADC to mistakenly interpret the received signal as varying between two different digital values, even though the actual signal may be relatively stable. The abundance of false readings can significantly impact the accuracy and reliability of the receiver's digital output. These false readings are often undesired and can be particularly problematic in systems that require precise and consistent data processing. The noise-induced crossings of the ADC threshold create spurious digital transitions that do not correspond to actual changes in the received signal.

However, in the context of IR-UWB, the signal presented at the input of the ADC has a distinct characteristic, which is a mixture of a high-power leakage with a high PAR and a low-power target signal together with the thermal noise. Such a unique mixture makes adopting the on-tread configuration possible. During the intervals of the burst of pulses, such as in the region 414 of the diagram 500, the high-power leakage is not presented. The received signal arriving at the input of the ADC is the mixture of a lower-power target signal and thermal noise. Since noise is inherently random and exhibits a statistical distribution around zero, the false readings generated by noise in a mid-rise ADC are also random. As a result, over time, the false readings will tend to average out, revealing the underlying pattern of the actual target signal. By applying suitable filtering techniques in digital processing (e.g., performed by the processor 202 of FIG. 2 or the process 140 of FIG. 1), the random noise-induced false readings can be smoothed out, and the true target signal can be extracted. This characteristic makes the on-tread setting particularly useful when the target signal is weak and may not reliably trigger the threshold if the ADC is set as mid-tread. In such cases, the on-tread setting allows for the reception and digitization of weak target signals that would otherwise remain undetected or fall below the detection threshold.

Figure 6:
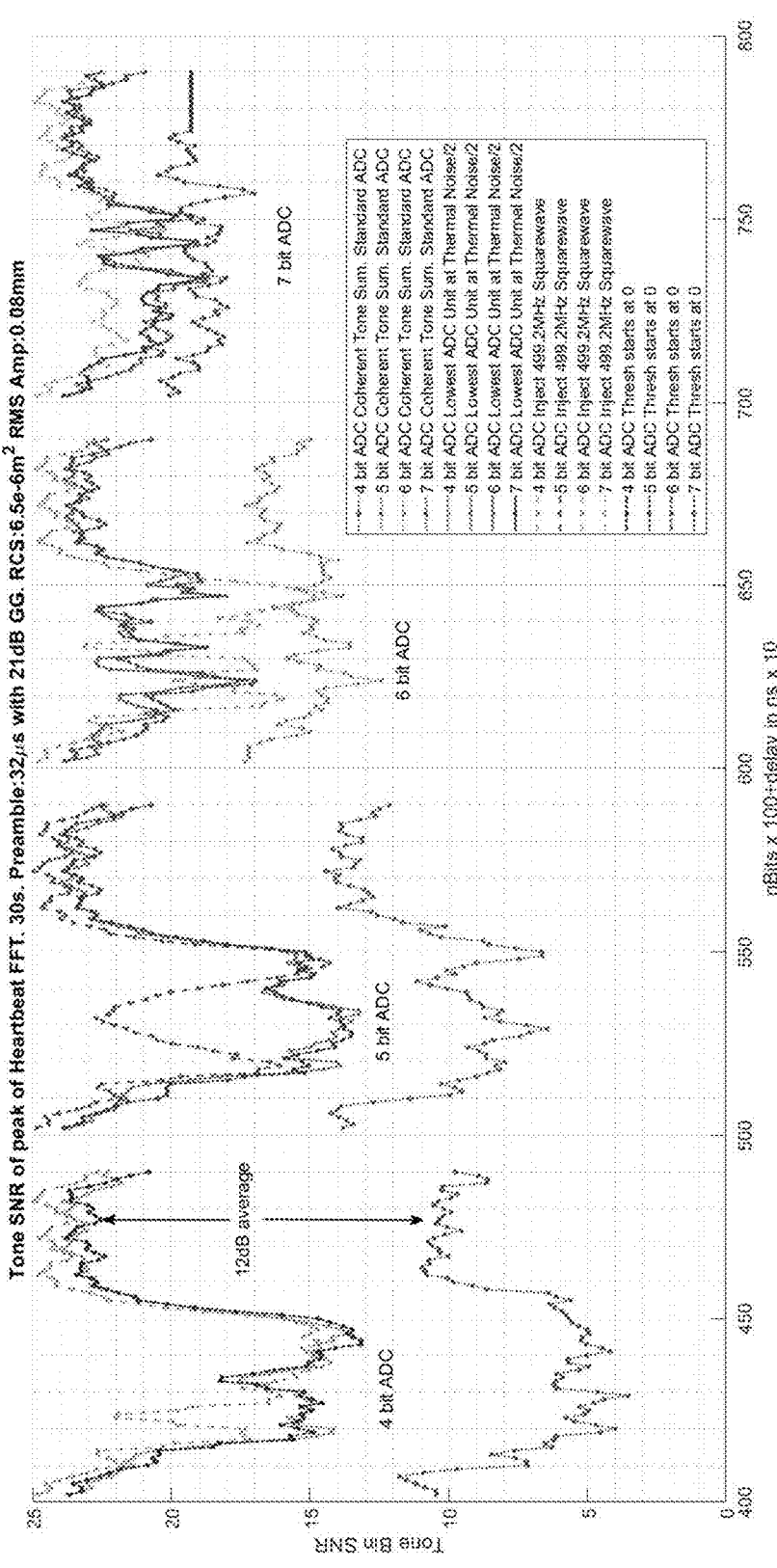
FIG. 6 illustrates improvements in ADC SNR performance by adopting on-tread configuration according to some aspects of the present disclosure.

FIG. 6 illustrates a comparison of ADC SNR performances in the context of IR-UWB between ADC mid-tread configuration and on-tread configuration with proper ADC algorithms. The lower row shows SNR performances of a 4-bit ADC, a 5-bit ADC, a 6-bit ADC, and a 7-bit ADC under the mid-tread configuration, respectively. Biometric sensing, such as heartbeat detection, usually requires an SNR of 12 dB for a successful detection. Only the 6-bit ADC and the 7-bit ADC provide an SNR of 12 dB, while the 4-bit ADC and the 5-bit ADC is way below this benchmark. As explained above, a higher-bit ADC provides a smaller step-size for the weak target signal to trip the lowest thresholds and thus achieving higher SNR more easily. By adopting the on-tread configuration and the proper ADC algorithm, the SNR performance of the 4-bit ADC is boosted for about 12 dB in average, allowing even the 4-bit ADC to competently provide an ADC resolution in a low-cost IR-UWB platform. The SNR performances of the 5-bit ADC, 6-bit ADC, and the 7-bit ADC are also improved to some degree by adopting the oh-tread configuration with proper ADC algorithms.

Figure 7:
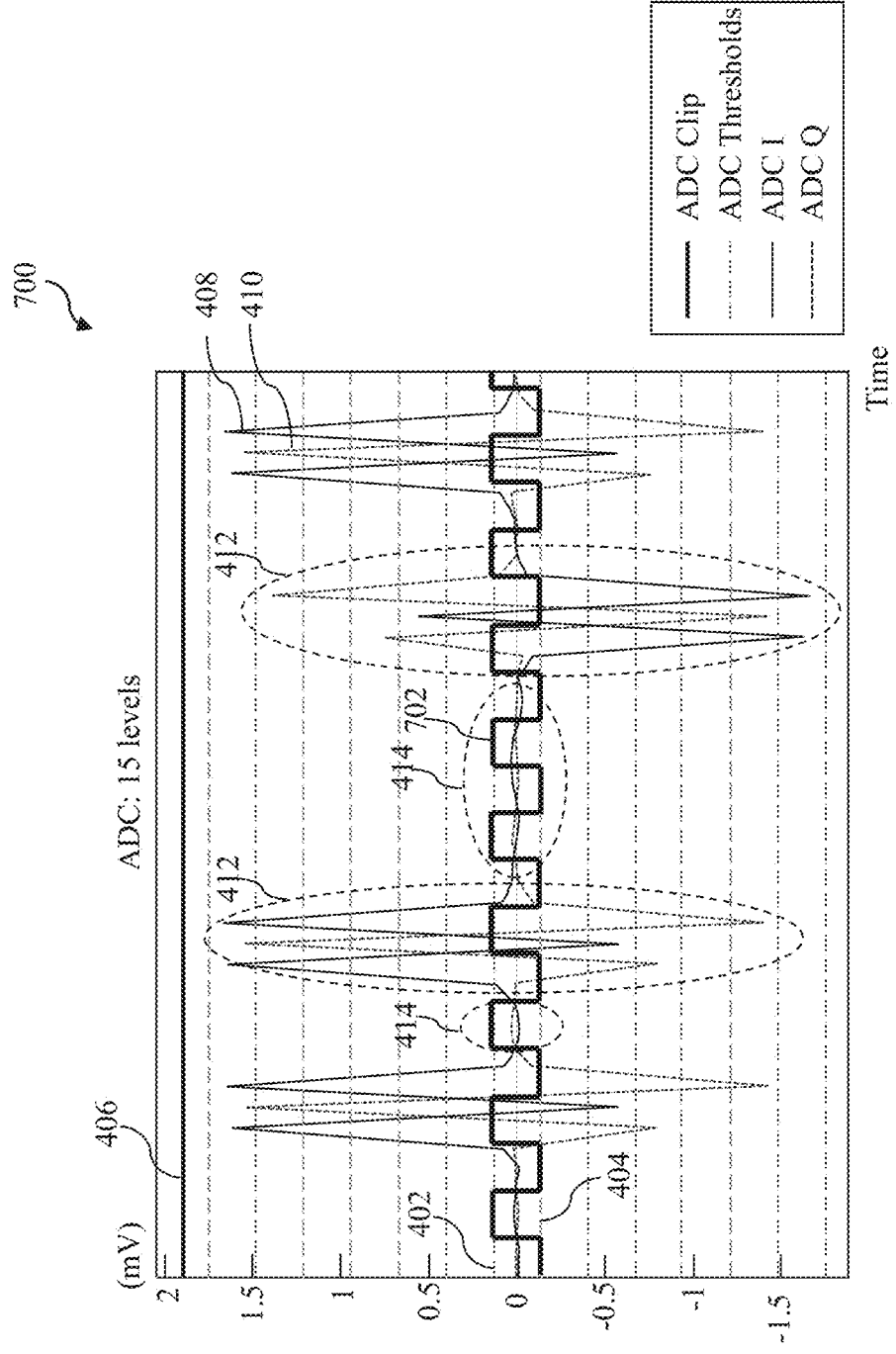
FIG. 7 illustrates a diagram showing superimposing a high frequency square wave to signal waveforms arriving at an ADC according to some aspects of the present disclosure.

The concept of shifting one of the ADC thresholds to align with the zero level of the target signal to make the target signal trip the threshold more often in the on-tread configuration can also be similarly applied to the ADC in the mid-tread configuration, but by shifting the target signal. FIG. 7 shows a diagram 700 illustrating such an implementation. The diagram 700 is similar to the diagram 400 of FIG. 4, including the threshold settings of the ADC as in the mid-tread configuration. One difference is that the in-phase (I) signal 408 and the quadrature (Q) signal 410 are not directly applied at the inputs of the ADCs, but to add with a square wave 702. The square wave 702 is centered at the zero-level with a peak-to-peak amplitude of one ADC step-size. The frequency of the square wave 702 may be half of the ADC sampling rate, but other frequencies may also be possible, such as a quarter of the ADC sampling rate, one-eighth of the ADC sampling rate, or at the ADC sampling rate. The square wave 702 may be generated by the processor 202 of FIG. 2 or the processor 140 of FIG. 1, and the adding of the I and Q signals with the square wave 702 may be performed by an adder circuit inserted between the ADC 208 and the receiver 210 of FIG. 2. Alternatively, the receiver 210 of FIG. 2 may include a square wave generator and an adder circuit to shift the I and Q signals before sending to the ADC 208.

In the regions 414 which are at the intervals between the bursts of pulses, by superimposing the square wave 702 on the target signal, the combined waveform will shift the target signal to either the lowest positive threshold 402 of the ADC or the lowest negative threshold 404 of the ADC. In either case, the combined waveform will trip the ADC thresholds more often, as the combined amplitude would exceeds the threshold, resulting in a successful detection and quantization of the signal. As discussed above, since noise is inherently random and exhibits a statistical distribution around zero, the false readings generated by noise in a mid-tread ADC are also random. As a result, over time, the false readings will tend to average out, revealing the underlying pattern of the actual target signal. By applying suitable filtering techniques in digital processing (e.g., performed by the processor 202 of FIG. 2 or the process 140 of FIG. 1), the random noise-induced false readings can be smoothed out, and the true target signal can be extracted. This technique effectively shifts the target signal to a higher amplitude level, enabling it to cross the mid-tread ADC's threshold and be accurately captured and digitized.

Figure 8:
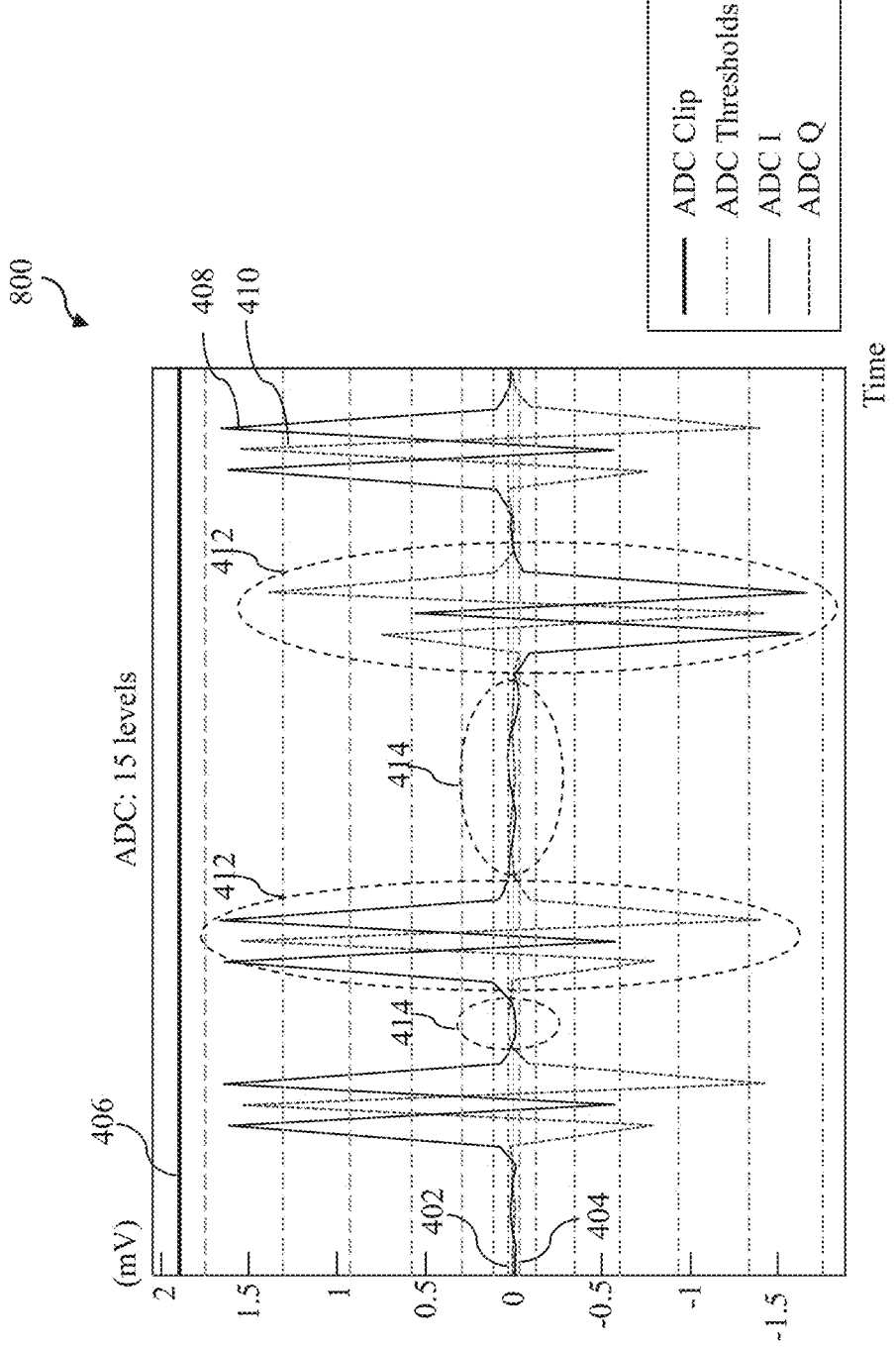
FIG. 8 illustrates a diagram showing dynamically adjusting ADC lowest thresholds to half noise RMS amplitude according to some aspects of the present disclosure.

FIG. 8 shows a diagram 800 illustrating another instance as an improvement to the lower-bit ADC in an IR-UWB radar allowing the target signal to more occasionally cross the thresholds of the ADC. The diagram 800 is similar to the diagram 400 of FIG. 4, including the threshold settings of the ADC as in the mid-tread configuration. One difference is that the lowest positive threshold 402 and the lowest negative threshold 404 are shifted closer to the zero level. Additionally or optionally, the other thresholds may be unevenly distributed from the zero level to the ADC clipping line 406, such that closer to the zero level, the smaller the ADC step-size and further from the zero level, the larger the ADC step-size. The unevenly distributed ADC thresholds allows more thresholds to be near the zero level and makes the weak target signal more visible to the ADC. In furtherance of the instance, the lowest positive threshold 402 and the lowest negative threshold 404 are positioned at the positive and negative half of the thermal noise root-mean-square (RMS) amplitude, respectively. The RMS amplitude is a statistical measure that provides an estimate of the average amplitude of the noise over time. Setting the lowest thresholds at half of the thermal noise RMS amplitude makes the weak target signal easier to trip the lowest thresholds. For example, the ADC may be originally set as in the mid-tread configuration with uniform spacing thresholds; after a power-on event, the ADC starts measuring the thermal noise RMS amplitude; and subsequently, the processor dynamically sets the ADC lowest thresholds to position at the positive and negative half of the thermal noise root-mean-square (RMS) amplitude, respectively. The other thresholds may remain unchanged. Additionally or optionally, the other thresholds may be dynamically adjusted to be unevenly distributed from the zero level to the ADC clipping line 406, such that closer to the zero level, the smaller the ADC step-size and further from the zero level, the larger the ADC step-size. Further, the ADC on-tread configuration as depicted in FIG. 5 may also adopt this scheme by having the positive and negative thresholds adjacent to the middle threshold (positioned at the zero level) to be positioned at positive and negative half of the thermal noise RMS amplitude, respective. The other thresholds other than the middle three thresholds (the zero level one, the positive half thermal noise RMS one, and the negative half thermal noise RMS one) may still be evenly spaced or un-evenly spaced.

Figure 9:
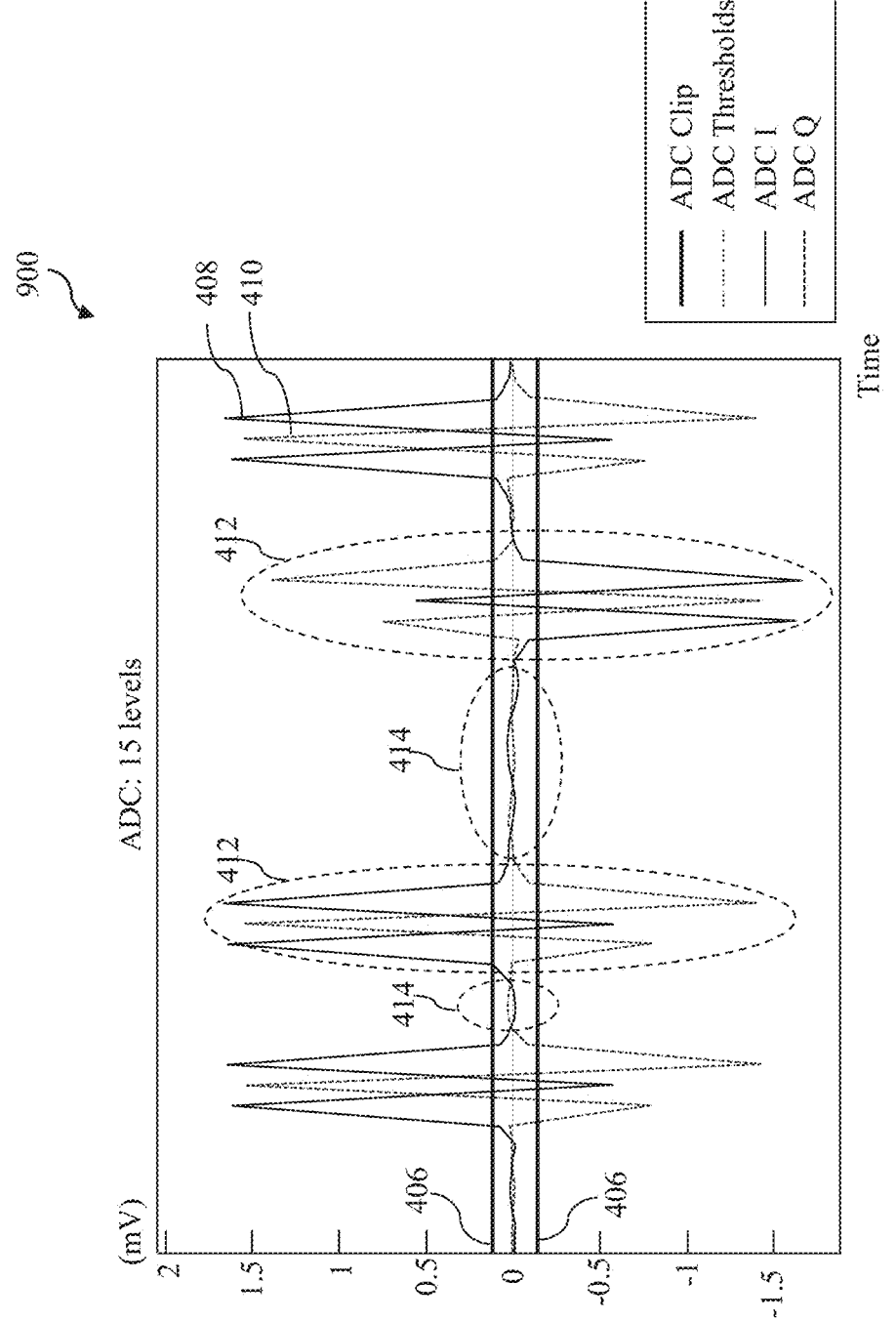
FIG. 9 illustrates a diagram showing dynamically compressing ADC clipping levels according to some aspects of the present disclosure.

FIG. 9 shows a diagram 900 illustrating another instance as an improvement to the lower-bit ADC in an IR-UWB radar allowing the target signal to more occasionally cross the thresholds of the ADC. The diagram 900 is similar to the diagram 400 of FIG. 4, in which the ADC is in the mid-tread configuration. One difference is that the ADC clipping lines 406 are compressed to where the lowest positive threshold 402 and the lowest negative threshold 404 were positioned. The thresholds (not shown in the diagram 900 for simplicity) may be evenly distributed between the ADC clipping lines 406 as in FIG. 4, or unevenly distributed between the ADC clipping lines 406 as in FIG. 8. In furtherance of the instance, the lowest positive threshold 402 and the lowest negative threshold 404 may be set at the positive and negative half of the thermal noise root-mean-square (RMS) amplitude, respectively.

In most cases, the clipping level of an ADC is intentionally set to be larger than the expected maximum amplitude of the input signal to avoid signal distortion. However, a specific scenario can arise where the large amplitude signal is not the desired target signal but rather a result of unwanted leakage or interference, while the actual signal of interest is relatively small, such as in the scenario of IR-UWB sensing. In such cases, the ADC may experience reduced resolution at the small amplitude region due to the relatively large threshold spacings. By reducing the clipping level, the ADC can effectively ignore or discard the large amplitude signals resulting from leakage, focusing its dynamic range on the desired small amplitude signals. This adjustment allows the ADC to better capture and digitize the weak target signals with higher precision and resolution. Although this modification sacrifices the ability to discern and accurately represent the large amplitude signals, it enables the ADC to be more sensitive to the small amplitude region, where the target signal lies. As a result, the ADC can effectively amplify and distinguish the desired weak signals, enhancing the resolution and fidelity of the digital output in the region of interest.

For example, the ADC may be originally set as in the on-tread configuration with uniform spacing thresholds; after a power-on event, the ADC starts measuring the thermal noise RMS amplitude; and subsequently, the processor dynamically sets the ADC clipping levels to where the lowest thresholds were positioned, and the lowest thresholds to be less than the thermal noise root-mean-square (RMS) amplitude, such as the positive and negative half of the thermal noise RMS amplitude. Other threshold values are possible, such as three quarters (¾), one third (⅓), one quarter (¼) of the thermal noise RMS amplitude. The other thresholds may still be evenly distributed. Additionally or optionally, the other thresholds may be dynamically adjusted to be unevenly distributed from the zero level to the ADC clipping level, such that closer to the zero level, the smaller the ADC step-size and further from the zero level, the larger the ADC step-size.

In the diagrams 500, 700, 800, and 900, the processor focuses computational resources for target signal detection in the regions 414 which is the intervals between the bursts of pulses, the ADC output from the regions 412 which is during the bursts of pulses may be discarded by the processor. Conventionally, the intervals between the bursts of pulses may not be separately considered, therefore, the research and development has been focused on how to reduce the leakage from the transmitter. For example, a pulse train of a high PRF may be preferred than a pulse train of a low PRF, due to the lower peak-to-average ratio of the pulses in the high PRF pulse train may require a lower ADC clip value. On the other hand, a pulse train of a low PRF may require a higher ADC clip value because it has a higher peak-to-average ratio. But a pulse train of a low PRF may have fewer collisions between the target and leakage pulses, which allows the ADC improvements illustrated in the diagrams 500, 700, 800, and 900 to take advantage of the longer intervals.

Figure 10:
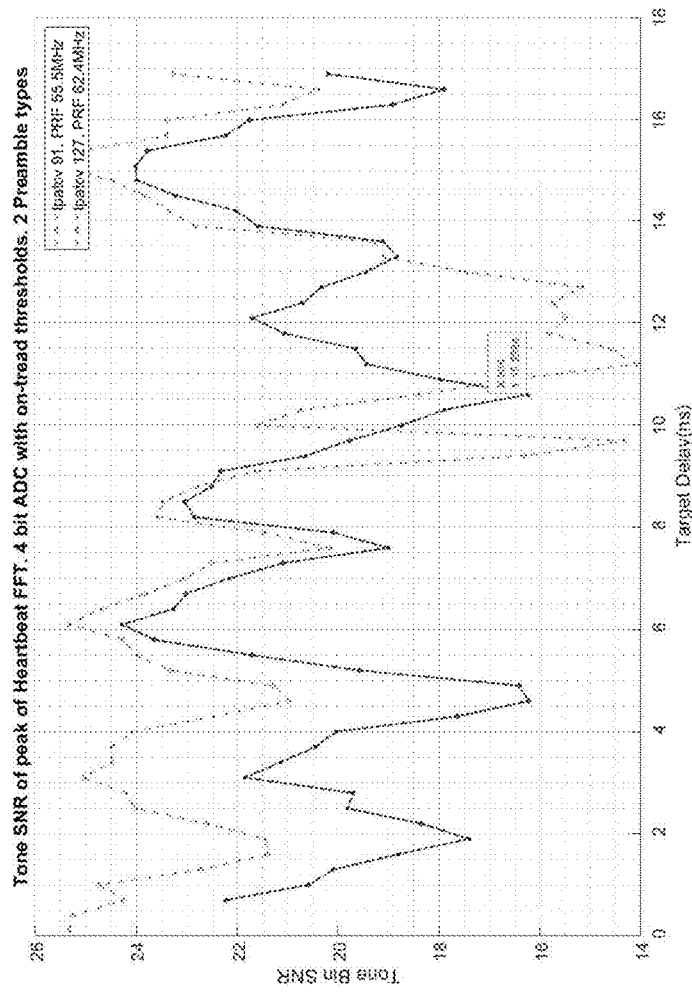
FIG. 10 illustrates a diagram showing comparison of ADC SNR performance under leakage pulse trains in an Ipatov 91 sequence and an Ipatov 127 sequence according to some aspects of the present disclosure.

The preamble used to probe the channel also has an impact on performance because it changes the interaction between the leakage and target signals. FIG. 10 shows the performance of two different preambles with similar PRFs and similar peak-to-mean ratios, one preamble including pulses based on Ipatov 91 sequence and another preamble including pulses base on Ipatov 127 sequence. Both sequences have an average of about 16 ns between pulses, but the Ipatov 91 always has a pulse free section 13 ns long whereas in the Ipatov 127 the pulses are sometimes in the first 8 ns and sometimes in the second 8 ns. This means that the worst-case performance of the Ipatov 127 sequence may be better as the Ipatov 127 sequence provides more windows of intervals for echo detection. As shown in FIG. 10, a 4-bit ADC based on an Ipatov 127 sequence has a minimum SNR of about 16 dB, while the same ADC based on an Ipatov 91 sequence has a minimum SNR of about 14 dB.

Figure 11:
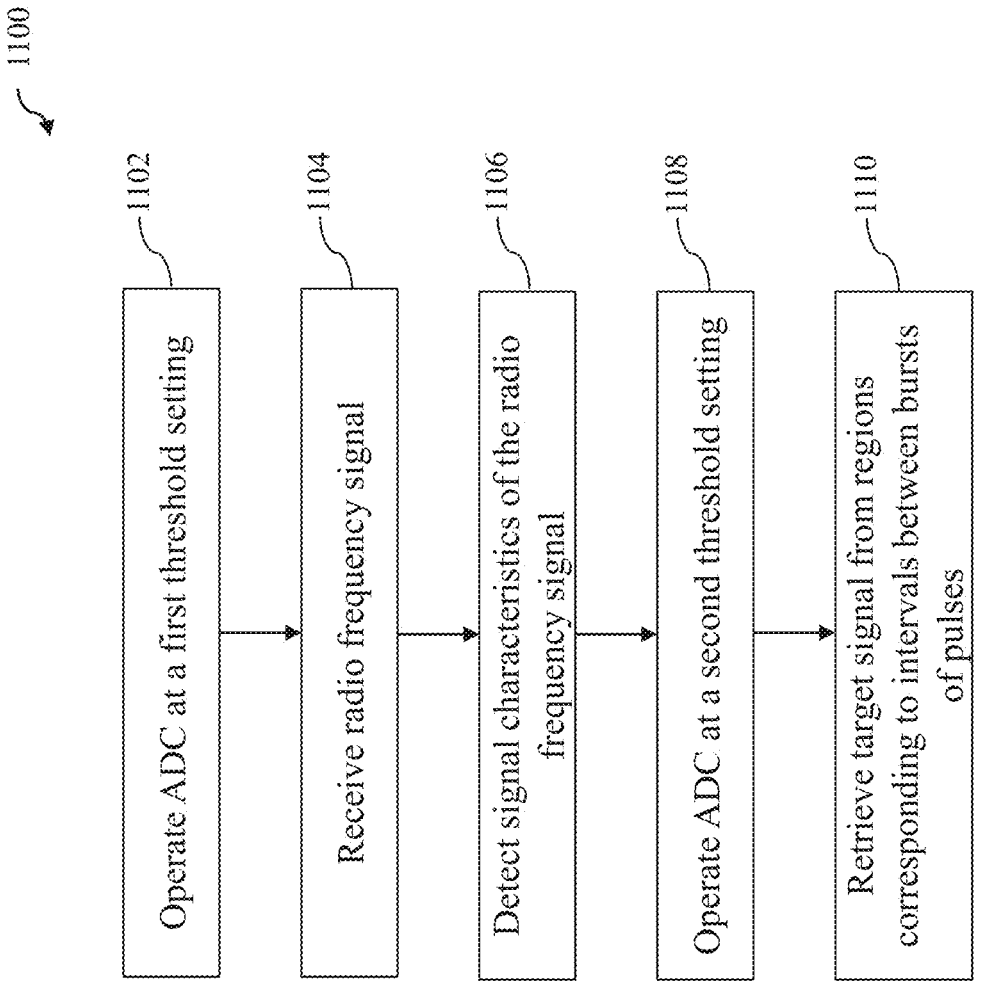
FIG. 11 illustrates a flow chart of a method for adjusting threshold settings of an ADC in a biometric sensing radar.

FIG. 11 illustrates a flow chart of a method 1100 for adjusting threshold settings of an ADC in a biometric sensing radar, such as an IR-UWB radar. The biometric sensing radar or a portion of the biometric sensing radar may be substantially similar to the electronic device 100 of FIG. 1 or the sensing radar transceiver 200 of FIG. 2. Additional operations can be provided before, during, and after method 1100, and some of the operations described can be moved, replaced, or eliminated for additional embodiments of method 1100. At operation 1102, the biometric sensing radar operates the ADC to work at a first threshold setting. The first threshold setting may be a mid-tread setting such as in FIG. 4. At operation 1104, the ADC receives the radio frequency signal, which includes a mixture of the target signal which is an echo bounced back from a target with a high-amplitude signal which is a leakage from the transmitter and a low-amplitude thermal noise. At operation 1106, the processor detects signal characteristics of the received radio frequency signal. The signal characteristics detection may include measuring the amplitude of the radio frequency signal to classify regions corresponding to the intervals between the bursts of pulses and regions corresponding to the durations when the bursts of pulses are transmitting. The signal characteristics may also include measuring the noise RMS amplitude. At operation 1108, the biometric sensing radar dynamically changes the ADC to operate at a second threshold setting different from the first threshold setting. The applying of the second threshold setting may include changing the ADC from the mid-tread configuration to the on-tread configuration such as in FIG. 5, adding a square wave with amplitude of one ADC step-size to the radio frequency signal such as in FIG. 7, moving the lowest thresholds to half of the noise RMS amplitude such as in FIG. 8, and/or lowering the ADC clipping levels together with redistributing thresholds between the ADC clipping levels evenly or un-evenly such as in FIG. 9. In various embodiments, such as shown in the diagrams 500, 700, 800, and 900, at least one of thresholds of the ADC is configured such that the ADC has a chance of at least 5% to be tripped by thermal noise at an input of the ADC regardless of the signal. For example, if one of the ADC's thresholds is set at the RMS amplitude of the thermal noise, there is approximately a 15.7% chance for the thermal noise to trip the respective ADC threshold, assuming a zero-mean Gaussian distribution. For another example, if one of the ADC's thresholds is set at less than the RMS amplitude of the thermal noise, there is a larger than 15.7% chance for the thermal noise to trip the respective ADC threshold. For yet another example, a lowest positive threshold of the ADC may be positioned at a positive half of an RMS amplitude of the thermal noise, and a lowest negative threshold of the ADC may be positioned at a negative half of the RMS amplitude of the thermal noise, such that there is larger than a 15.7% chance for the thermal noise to trip the ADC. The present disclosure also contemplates that the lowest threshold to be positioned around or slightly above the RMC amplitude of the thermal noise, such that there is less than 15.7% but still larger than 5% a chance for the ADC to be tripped. The 5% chance is neither trivial nor arbitrary. With an at least 5% chance for the ADC to be tripped by thermal noise at its input regardless of a radio frequency signal, the second threshold setting assists the radio frequency signal when presented to cross the ADC thresholds more often and improves the ADC's chance to discern the target signal. At operation 1110, the processor retrieves target signal from the ADC output by filtering out quantization due to noise, in which the signal processing may be applied to the intervals between bursts of pulses instead of the duration when bursts of pulses are transmitted.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A sensing radar, comprising:
a transmitter configured to transmit bursts of pulses;
a receiver configured to receive a signal comprising an echo from the bursts of pulses and a leakage of the bursts of pulses from the transmitter to the receiver;
an analog-to-digital converter (ADC) coupled to the receiver, wherein at least one of thresholds of the ADC is configured such that the ADC has a chance of at least 5% to be tripped by thermal noise at an input of the ADC regardless of an amplitude of the signal; and
a processor coupled to the ADC, wherein the processor is configured to process an output of the ADC at intervals of the bursts of pulses and ignore durations of transmitting the bursts of pulses to retrieve the echo from the signal.

2. The sensing radar of claim 1, wherein a lowest positive threshold of the ADC is positioned at a positive half of a root-mean-square (RMS) amplitude of the thermal noise, and a lowest negative threshold of the ADC is positioned at a negative half of the RMS amplitude of the thermal noise.

3. The sensing radar of claim 1, wherein the thresholds of the ADC are evenly spaced.

4. The sensing radar of claim 1, wherein the thresholds of the ADC are unevenly spaced.

5. The sensing radar of claim 1, wherein a clipping level of the ADC is below an amplitude of the signal received by the ADC and in proximity of a root-mean-square (RMS) amplitude of the thermal noise.

6. The sensing radar of claim 1, wherein the ADC is operable to work in a mid-tread threshold setting.

7. The sensing radar of claim 1, wherein the ADC is operable to work in an on-tread threshold setting.

8. The sensing radar of claim 1, wherein the bursts of pulses are based on an Ipatov sequence.

9. A biometric sensing radar, comprising:
a transmitter configured to transmit bursts of pulses;
a receiver configured to receive a signal comprising an echo from the bursts of pulses and a leakage of the bursts of pulses from the transmitter to the receiver;
an analog-to-digital converter (ADC) coupled to the receiver, wherein the ADC is operable to work in an on-tread threshold setting; and
a processor coupled to the ADC, wherein the processor is configured to process an output of the ADC at intervals of the bursts of pulses and ignore durations of transmitting the bursts of pulses to retrieve the echo from the signal, and wherein the processing of the output of the ADC includes a filtering process to filter out quantization of thermal noise.

10. The biometric sensing radar of claim 9, wherein under the on-tread threshold setting, thresholds of the ADC are evenly spaced.

11. The biometric sensing radar of claim 9, wherein under the on-tread threshold setting, thresholds of the ADC are unevenly spaced.

12. The biometric sensing radar of claim 9, wherein under the on-tread threshold setting, a threshold adjacent to a zero level of the ADC is positioned at a half of a noise root-mean-square (RMS) amplitude.

13. The biometric sensing radar of claim 9, wherein the ADC is operable to work in a mid-tread threshold setting and switch from the mid-tread threshold setting to the on-tread threshold setting under a control of the processor.

14. A biometric sensing radar, comprising:
a transmitter configured to transmit bursts of pulses;
a receiver configured to receive a signal comprising an echo from the bursts of pulses and a leakage of the bursts of pulses from the transmitter to the receiver;
an analog-to-digital converter (ADC) coupled to the receiver; and
a processor coupled to the ADC,
wherein the processor is configured to:
set the ADC to work in a first threshold setting;
detect characteristics of the signal from output of the ADC;
set the ADC to work in a second threshold setting different from the first threshold setting, wherein the processor is configured to process an output of the ADC at intervals of the bursts of pulses and ignore durations of transmitting the bursts of pulses to retrieve the echo from the signal, and wherein the processing of the output of the ADC includes a filtering process to filter out quantization of thermal noise; and
retrieve the echo from the signal.

15. The biometric sensing radar of claim 14, wherein the first threshold setting is a mid-tread threshold setting, and the second threshold setting is an on-tread threshold setting.

16. The biometric sensing radar of claim 14, wherein the first threshold setting is a first mid-tread threshold setting with evenly spaced thresholds, and the second threshold setting is a second mid-tread threshold setting with unevenly spaced thresholds.

17. The biometric sensing radar of claim 16, wherein under the second mid-tread threshold setting, a lowest positive threshold above a zero level of the ADC is positioned at a positive half of a noise root-mean-square (RMS) amplitude, and a lowest negative threshold under the zero level of the ADC is positioned at a negative half of the noise root-mean-square (RMS) amplitude.

18. The biometric sensing radar of claim 14, wherein the second threshold setting includes superimposing a square wave on the signal, wherein a swing of the square wave is one ADC step-size.

19. The biometric sensing radar of claim 14, wherein the first threshold setting includes a first ADC clipping level, and the second threshold setting includes a second ADC clipping level that is lower than the first ADC clipping level.

20. The biometric sensing radar of claim 14, wherein to detect characteristics of the signal, the processor is configured to measure an amplitude of the signal to classify regions corresponding to intervals between the bursts of pulses and regions corresponding to durations when the bursts of pulses are transmitting.

* * * * *